US006852566B2

(12) United States Patent
Yaung

(10) Patent No.: US 6,852,566 B2
(45) Date of Patent: Feb. 8, 2005

(54) SELF-ALIGNED REAR ELECTRODE FOR DIODE ARRAY ELEMENT

(75) Inventor: Dun-Nian Yaung, Taipei (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/386,871

(22) Filed: Mar. 12, 2003

(65) Prior Publication Data

US 2004/0178416 A1 Sep. 16, 2004

(51) Int. Cl.[7] .................. H01L 21/00; H01L 31/075
(52) U.S. Cl. ................ 438/74; 257/53; 257/292; 257/458; 257/755; 257/756; 438/73; 438/96
(58) Field of Search ................ 257/756, 53, 755, 257/292, 458; 438/73, 74, 96

(56) References Cited

U.S. PATENT DOCUMENTS 6,300,648 B1 * 10/2001 Mei et al. .................. 257/59
6,501,065 B1 * 12/2002 Uppal et al. ............. 250/214.1

* cited by examiner

Primary Examiner—Jerome Jackson
(74) Attorney, Agent, or Firm—Tung & Associates

(57) ABSTRACT

A PIN active pixel sensor array including self aligned encapsulated electrodes and a method for forming the same the method including forming an electrically conductive layer over a substrate; forming a first doped semiconductor layer over the conductive layer; photolithographically patterning and etching through a thickness portion of the first doped semiconductor layer and conductive layer to expose the substrate to form a plurality of spaced apart electrodes having an upper portion comprising the first doped semiconductor layer; blanket depositing a second doped semiconductor layer to cover the spaced apart electrodes including the exposed substrate; and, etching through at least a thickness portion of the second doped semiconductor layer.

19 Claims, 2 Drawing Sheets

SELF-ALIGNED REAR ELECTRODE FOR DIODE ARRAY ELEMENT

FIELD OF THE INVENTION

This invention generally relates to diode array elements, including diode array elements used for sensing applications and more particularly, to a diode element and method for forming the same, including elevated PIN thin film photodiodes for active pixel arrays.

BACKGROUND OF THE INVENTION

A conventional imaging sensor array is formed from a plurality of photosensitive pixel elements typically arranged in an array forming rows and columns. The size of pixel elements has decreased and associated sensor circuitry has been integrated into multi-level integrated circuit devices. The photosensitivity of the pixel elements including photodiodes has correspondingly required improvement to counteract the effects of increased light scattering, low u-lens gain, and low fill factor. For example the fill factor, as is commonly referred to in the art, is the ratio of a photodetector area divided by the pixel area. For example, a photodetector typically includes an array of photosensitive elements often referred to as pixels including spacing between the pixel array rows and columns which are not active in photosensing. A higher fill factor is one method to increase photosensitivity.

Recently elevated PIN photodiodes with high fill factors have been used to increase photosensitivity. One problem with elevated PIN photodiodes has been related to vertical leakage current that occurs at metal and intrinsic amorphous silicon forming Schottky junction interfaces. For example, typically intrinsic amorphous silicon sensor material, also referred to as an I-layer creates charge carriers upon illumination with light through a P+ doped amorphous silicon portion (layer). The charge carriers are then selectively collected by a Schottky diode electrode formed of an N+ doped amorphous silicon portion over a metal portion. The metal portion collects the charge from the N+ doped amorphous silicon portion for transport to detector or readout electronics, for example including CMOS transistors.

During the formation of the of the photodiode sensors, prior art processes have frequently left metal portions of the Schottky diode electrode in contact with the I-layer. As a result, vertical leakage current upon application of a bias voltage to the Schottky diode electrode resulted in degraded charge collection and photosensitivity of the PIN photodiodes. For example, under reverse bias conditions, a leakage current resulting from contact injection occurs at interface of the intrinsic amorphous silicon layer (I-layer) and the metal portion or back contact.

While several PIN sensor elements have been disclosed in the prior art, the teachings as disclosed in Theil et al., in U.S. Pat. No. 6,018,187 and Mei et al., in U.S. Pat. No. 6,288,435 are incorporated herein by reference.

For example, in Mei et al., an approach to address the vertical leakage current problem has been to extend to N+ amorphous silicon layer, for example in a mushroom shaped contact electrode, to cover metal/I-layer interfaces. For example in attempting to extend the collection array of PIN structure mushroom shaped rear electrodes have been proposed. One problem with such structures has been vertical leakage current due to contact of the active layer (I-layer) with the conductive portion of the electrode.

One problem with the method of the prior art in forming thin film PIN photodiodes is that mushroom shaped contacts increase the electrode size which increases an active pixel size. The increased size of the electrode including the extension of the N+ doped amorphous silicon layer to encapsulate the metal portion has the o setting effect of decreasing the fill factor thereby lowering photosensitivity. In addition, the method is time consuming and costly in terms of throughput and processing costs in that least two photolithographic patterning steps must be performed to form the extended N+ doped amorphous silicon layer.

There is therefore a need in the image sensor art for an improved PIN sensor including rear electrode formation to improve a thin film PIN photodiode fill factor while avoiding the formation of Schottky junctions producing a vertical leakage current.

It is therefore an object of the invention to provide a PIN sensor a that has a thin film PIN photodiode fill factor including rear electrode formation.

It is another object of the invention to provide a method of forming a PIN sensor while avoiding the formation of Schottky junctions by producing a vertical leakage current in addition to overcoming other deficiencies and shortcomings of the prior art.

SUMMARY OF THE INVENTION

To achieve the foregoing and other objects, and in accordance with the purposes of the present invention as embodied and broadly described herein, the present invention provides a PIN active pixel sensor array including self aligned encapsulated electrodes and a method for forming the same.

In a first embodiment, the method includes forming an electrically conductive layer over a substrate; forming a first doped semiconductor layer over the conductive layer; photolithographically patterning and etching through a thickness portion of the first doped semiconductor layer and conductive layer to expose the substrate to form a plurality of spaced apart electrodes having an upper portion comprising the first doped semiconductor layer; blanket depositing a second dope semiconductor layer to cover the spaced apart electrodes including the exposed substrate; and, etching through at least a thickness portion of the second doped semiconductor layer to expose the substrate while leaving at least a portion of the second doped semiconductor layer covering the sidewall portions of the plurality of spaced apart electrodes.

In a second embodiment, the PIN active pixel sensor array includes self aligned encapsulated rear electrodes including a patterned array of rectangular shaped conductive first electrode elements formed over a substrate and each of the first electrode elements including sidewalls; each of the first electrode elements further comprising first and second doped semiconductor layers including a first doping polarity the first doped semiconductor layer covering the surface portion and the second doped semiconductor layer covering the sidewalls to encapsulate each of the first electrode elements on three sides; an overlying photoactive charge generating semiconductor layer contacting the first and second semiconductor layers of each of the first electrode elements; and, a third doped semiconductor layer forming a second electrode element comprising a second doping polarity opposite to the first doping polarity disposed over and contacting the photoactive charge generating semiconductor layer.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to and is particularly advantageously implemented in forming a PIN thin film photodiode for image sensing it will be appreciated that the self aligned rear electrode of the present invention may be advantageously used in other types of active pixel type array sensing devices to increase a fill factor and to reduce a vertical current leakage.

In an exemplary embodiment of the present invention, reference is made to FIGS. 1A–1E where cross sectional side views of a portion of a thin film PIN photodetector is shown at stages in manufacture according to an embodiment the present invention.

Figure 1A:
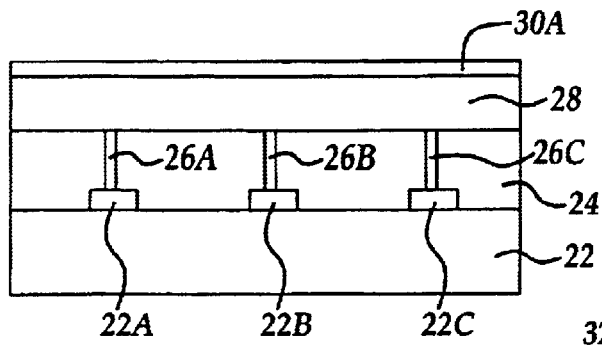
FIGS. 1A–1E are cross sectional side views of a portion of an elevated PIN photodiode at manufacturing stages according to embodiments of the present invention.

Referring to FIG. 1A is shown a semiconductor substrate 22, for example a silicon substrate including overlying CMOS transistors 22A, 22B, and 22C, for example thin film transistors formed according to known methods. Formed overlying the CMOS transistors is a dielectric insulating layer 24, for example a silicon oxide or silicon oxynitride containing dielectric insulating layer formed according to known methods, for example PECVD, HDP-CVD. Metal interconnect lines, 26A, 26B, and 26C, also known as vias are formed in dielectric insulating layer 24 by conventional photolithographic patterning and reactive ion etching techniques followed by backfilling the via openings with a metal, preferably tungsten, aluminum or copper or alloys thereof. It will be appreciated that the metal interconnect lines may be single damascene or dual damascene structures.

A conductive layer 28 is then blanket deposited by conventional methods, for example, PVD or CVD methods to form a conductive layer for forming an electrode back contact in a PIN structure for carrying collected current to counting or readout electronics, for example CMOS transistors. While the electrode back contact may be made of any conducing material, including doped polysilicon, preferably it is a metal since metals have superior electrical conductivity. For example the conductive layer 28 may be formed of any electrically conductive metal including titanium, tungsten, aluminum, copper, chromium, platinum, or their alloys. For example, the conductive layer may be constructed of a multiple layers of metals. For example the metal layer 28 is deposited to a thickness of about 3000 Angstroms to about 10000 Angstroms.

Blanket deposited over the metal layer 28 is a first doped semiconductor layer 30A having a first majority charge carrier doping polarity, for example N+ doped amorphous silicon (first N+ layer) formed at a thickness of from about 200 Angstroms to about 1000 Angstroms and having an appropriate dopant concentration, for example about $10^{18}$ to about $10^{22}$ N dopant atoms/cm$^3$. It will be appreciated that there are wide variety of doped semiconductor materials that may be used in forming a PIN photodiode, including the doped semiconductor layer 30A overlying the metal layer 28. For example, semiconductor materials may include secondary semiconductor materials such as silicon carbide (e.g., SiC) and tertiary or quaternary semiconductor materials such as InGaAS and InGaAsP. Preferably, the semiconductor materials used to form the PIN photodiode including doped semiconductor layer 30A are formed as amorphous materials at temperatures such that thermal damage to the metal portions of the electrode and metal interconnects is avoided. In the exemplary embodiment, PIN structure is shown where the N region of the PIN structure is formed overlying the metal layer 28 for subsequent formation of electrodes, however it will be appreciated the N an P regions of the PIN structure may be interchanged, as will be appreciated by one skilled in the art of designing PIN photodiodes, where the P region is formed overlying the metal (conductive) layer 28 which forms a back metal contact portion of the subsequently formed rear electrode. The N+ layer 30A to form the N region of the PIN structure may be deposited and doped by any method for forming amorphous doped semiconductor layers such as CVD processes including LPCVD, PECVD or HDP-CVD by reacting silane with the wafer where the temperature kept below about 580° C. Preferably, the N+ layer 30A formed of N doped amorphous silicon includes hydrogen incorporated into the amorphous silicon layer remaining from the silane reaction to form amorphous silicon and hydrogen. The N doping may be added in-situ in the CVD amorphous silicon deposition process, for example adding phosphine ($PH_3$) or arsine ($AsH_3$) gas during the deposition process or conducting a diffusion doping process following deposition of an amorphous silicon layer.

Figure 1B:
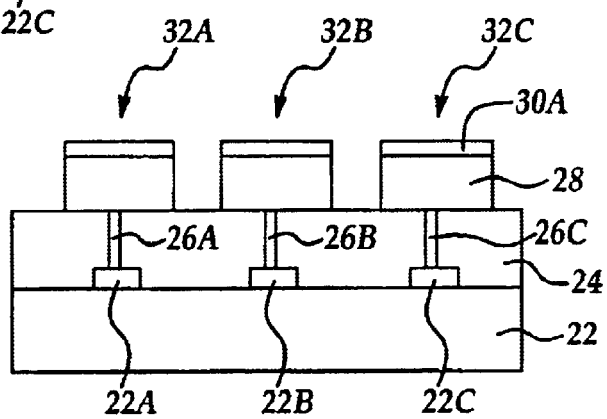

Referring to FIG. 1B, a conventional photolithographic patterning and etching process including a wet or dry etching process, but preferably an anisotropic RIE etching process, is carried out to pattern and etch through the doped semiconductor layer, for example the N+ layer 30A and metal layer 28 to form spaced apart patterned electrodes, e.g., 32A, 32B, 32C, also referred to as rear electrodes or pixel electrodes. In one embodiment, the electrodes are preferably rectangular in shape and the size of the pixels may vary from a few microns on a side to about 100 microns on a side. In another embodiment, the electrodes may be U-shaped electrodes as shown in FIG. 1.

Figure 1C:
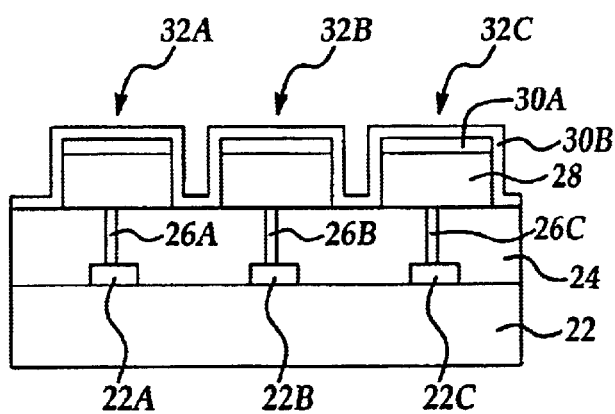

Referring to FIG. 1C, according to the exemplary embodiment a second doped semiconductor layer 30B having a first majority charge carrier doping, for example a second N+ doped amorphous silicon (second N+ layer) is blanket deposited over the first N+ layer 30A to include covering the spaces formed between the electrodes, e.g., 32A, 32B, 32C during the RIE etching process. The thickness of the second N+ layer may be less than or greater than the first N+ layer, but is preferably formed at about the same thickness or less, such thickness depending on the doped semiconductor layer material and desired band bending and charge collection characteristics of the electrode as will be appreciated by one skilled in the art.

Figure 1D:
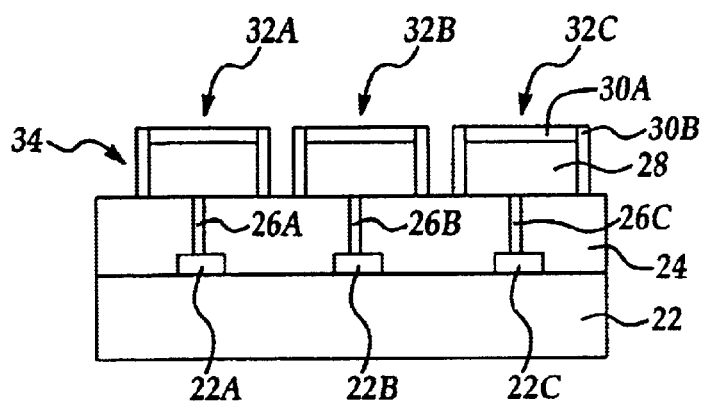

Referring to FIG. 1D, a wet or dry etching process, more preferably a dry etching process, is carried out to etch back (remove) the second N+ layer over a top portion of the electrodes e.g., 32A, 32B, 32C, including the exposing the substrate adjacent or between the electrodes to leave at least a portion of the second N+ layer covering the sidewall portions e.g., 34 covering the metal portion of the electrodes e.g., 32A, 32B, 32C and at least a portion of the first N+ layer over the top portion covering the metal portion of the electrodes to form a self-aligned rear electrode encapsulating (on three sides) the metal portion of the electrode. Preferably, the thickness of the first N+ layer remaining over the top portion of the electrode is about equal to the portion of the second N+ layer remaining over the sidewall portions of the electrode, for example between about 200 and about 1000 Angstroms.

Figure 1E:
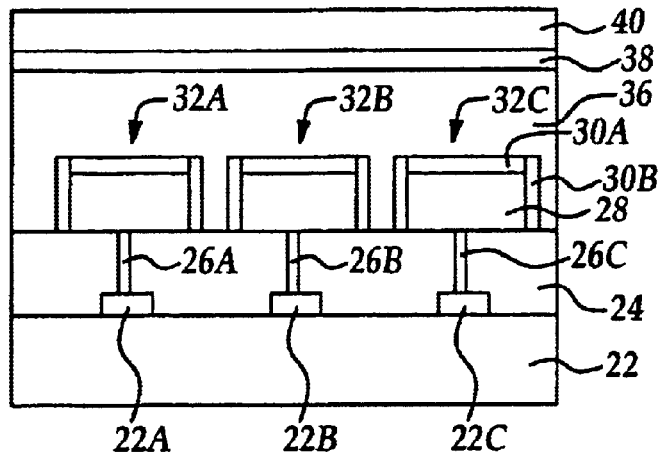

Referring to FIG. 1E, the PIN photodiode is completed by forming a photoactive region 36 by blanket depositing one or more overlying layers of charge generating semiconductor material, for example an intrinsic (undoped) semiconductor material, and in a preferred embodiment, an intrinsic amorphous silicon layer (I-layer). It will be appreciated that many different types of charge generating semiconductor materials may be used as are known in the PIN photodiode art including multiple layers of semiconductor materials. In a preferred embodiment, an overlying doped semiconductor layer 38 having an opposite polarity to the first and second doped semiconductor layers, for example a the P-doped semiconductor layer forming a front electrode common to the rear electrode elements is formed over the photoactive region 36, for example by forming a P+ doped amorphous silicon layer (P+ layer) by a CVD process including a P doping process, for example by an in-situ doping process by adding a such as diborane ($B_2H_6$) during the CVD process and/or by contacting the amorphous silicon layer with a boron containing gas in a diffusion doping process following deposition. It will be appreciated other doping processes including ion implantation may be optionally used as well. Finally, an overlying photon transparent layer 40 of a conductive material, for example indium tin oxide, also referred to as ITO, is deposited to form a front or upper electrode for applying a voltage bias during the charge generation and collection process. It will be appreciated that other photon transparent conductive materials may be used in forming the photon transparent layer including, for example, transition metal nitride and oxides.

In operation, for example, a Voltage bias is applied to the front and rear electrodes of the PIN photodiode during charge generation (e.g., illumination) whereby photons (or other charge generating flux) pass through the photon transparent conducting layer 40 to generate electrons and holes in the intrinsic amorphous silicon layer 36. To began the charge collection process a bias Voltage applied to the front and rear electrodes e.g., 38 and 32A across the active I-layer 36 to generate an electric field that separates charge carriers, for example moving electrons from the active I-layer to the rear electrode passing through the N+ region (e.g., 30A) to the metal back contact portion of the rear electrode e.g., 32A and subsequently to readout or counting electronics e.g., CMOS transistors e.g., 22A, 22B and 22C through metal interconnects e.g., 26A, 26B, and 26C.

Figure 2:
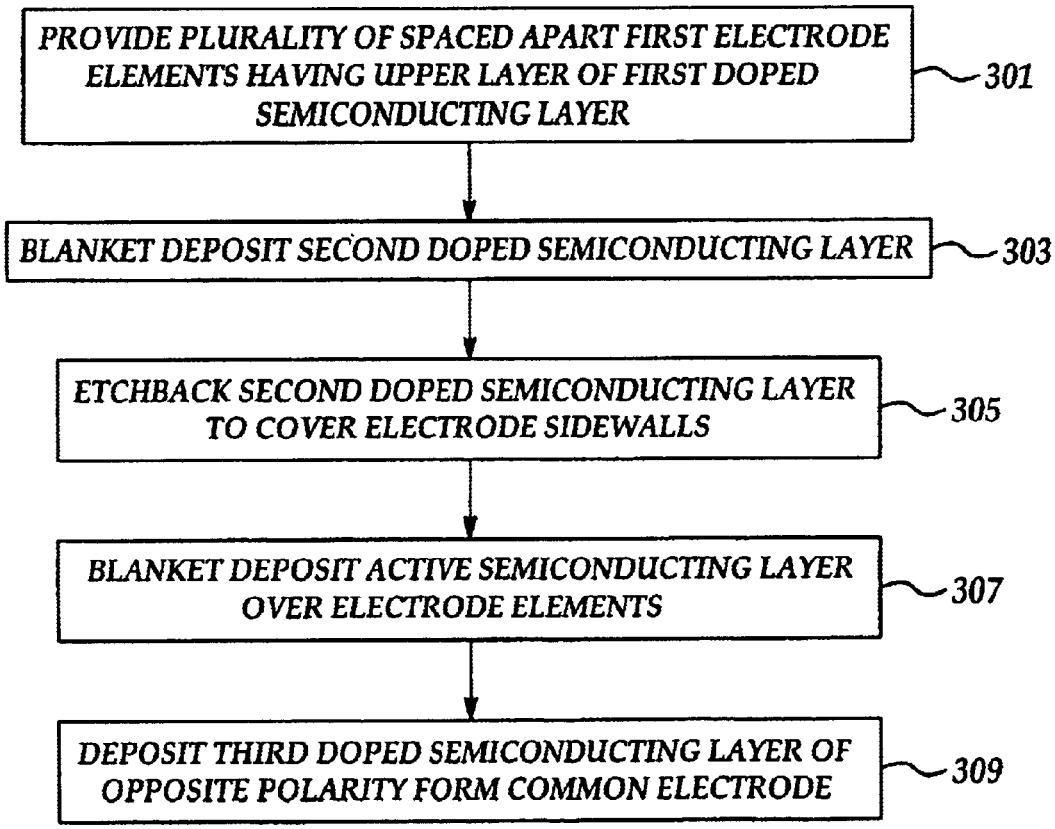
FIG. 2 is a process flow diagram including several embodiments of the present invention.

Referring to FIG. 2 is a process flow diagram including several embodiments of the method of the present invention in forming a self aligned rear electrode for use in an active pixel sensor, for example a photodiode. In process 301 a plurality of spaced apart first conductive electrode elements are provided having an upper first doped semiconductor layer of a first polarity overlying an upper portion. In process 303, a second doped semiconductor layer of the first polarity, for example N or P doped amorphous silicon, is blanket deposited over the plurality of spaced apart first electrode elements. In process 305, the second doped semiconductor layer is etched back to remove at least the thickness extending perpendicular to the wafer process surface to leave at least a portion of the first doped semiconductor layer covering the top portions of the first electrode elements and at least a portion of the second doped semiconductor layer covering the sidewalls of the first electrode elements. In process 307, a photoactive charge generating semiconductor layer (active layer) is blanket deposited over the first electrode elements. In process 309, a third doped semiconductor layer of opposite doping polarity to the first doping polarity is deposited over the active layer to form a second electrode common to the plurality of first electrode elements.

Thus, an active PIN pixel sensor array and a method for forming the same has been presented including forming self aligned rear electrodes wherein a metal/active layer interface is eliminated by encapsulating the metal back contact of the rear electrode with a doped semiconductor layer in a self-aligned etchback formation process. The encapsulated metal portions of the rear electrodes have the advantageous effect of reducing vertical leakage current at a metal/active layer interface. In addition, the method allows a high density of pixels to be formed thus increasing a fill factor by limiting an increase in the required rear electrode size. In addition, the self-aligned electrode formation process increases processing efficiency by reducing costs and increasing a throughput by requiring only a single photolithographic patterning step.

The preferred embodiments, aspects, and features of the invention having been described, it will be apparent to those skilled in the second art that numerous variations, modifications, and substitutions may be made without departing from the spirit of the invention as disclosed and further claimed below.

What is claimed is:

1. A method for forming a self-aligned encapsulated electrode for a PIN sensor comprising the steps of:
    forming an electrically conductive layer over a substrate;
    forming a first doped semiconductor layer over the conductive layer;
    photolithographically patterning and etching through a thickness portion of the first doped semiconductor layer and conductive layer to expose the substrate to form a plurality of spaced apart electrodes having an upper portion comprising the first doped semiconductor layer;
    blanket depositing a second doped semiconductor layer to cover the spaced apart electrodes including the exposed substrate; and,
    etching through at least a thickness portion of the second doped semiconductor layer to expose the substrate while leaving at least a portion of the second doped semiconductor layer covering the sidewall portions of the plurality of spaced apart electrodes.

2. The method of claim 1, wherein the electrically conductive layer comprises a metal.

3. The method of claim 1, wherein the electrically conductive layer comprises doped polysilicon.

4. The method of claim 1, wherein the substrate comprises a dielectric insulating material including electrically conductive interconnects communicating with sensor electrodes and CMOS transistors.

5. The method of claim 4, wherein the electrically conductive interconnect comprises a metal filled via.

6. The method of claim 1, wherein the first and second doped semiconductor layers comprise one of a P and N doped semiconductor material.

7. The method of claim 6, wherein the doped semiconductor material is selected from the group consisting of amorphous silicon, silicon germanium, gallium arsenide, indium phosphide, and silicon carbide.

8. The method of claim 7, wherein the doped semiconductor material is amorphous silicon formed by a CVD process including doping the amorphous silicon by one of an N or P dopant containing gas according to one of an in-situ doping process and a diffusion doping process.

9. The method of claim 1, wherein the second doped semiconductor layer is formed of the same material as the first doped semiconductor layer.

10. The method of claim 1, wherein the thickness of the second doped semiconductor layer is formed at a thickness about equal to or less than the first doped semiconductor layer.

11. The method claim 1, wherein the step of etching comprises at least one of a wet and dry etching process.

12. The method of claim 11, wherein the step of etching is a substantially anisotropic reactive ion etching (RIE) process.

13. A method for forming self aligned rear electrodes for PIN sensor elements comprising the steps of:

providing a substrate;

forming over the substrate a patterned plurality of spaced apart electrode each electrode comprising a lower conductive layer and an upper first doped semiconductor layer;

blanket depositing a second doped semiconductor layer over the plurality of spaced apart electrodes to include covering electrode sidewall portions; and, etching through a thickness of the second doped semiconductor layer to leave at least a portion of the second doped semiconductor layer covering the electrode sidewall portions to form a plurality of encapsulated self aligned rear electrodes.

14. The method of claim 13, wherein the lower conductive layer comprises at least one metal.

15. The method of claim 13, wherein the first and second doped semiconductor layers comprise one of N and P doped semiconductor material.

16. The method of claim 15, wherein the first and second doped semiconductor layers comprise amorphous silicon.

17. The method claim 13, further comprising the step of blanket depositing an intrinsic amorphous semiconductor material layer over the plurality of electrodes.

18. The method of claim 17, further comprising the step of blanket depositing a third doped semiconductor layer over the intrinsic amorphous semiconductor material layer wherein the third doped semiconductor layer having an opposite doping conductivity with respect to the first and second doped semiconductor layers.

19. The method of claim 18, further comprising the step of blanket depositing a photon transparent electrically conductive layer over the third doped semiconductor layer to form a front electrode.

* * * * *